United States Patent [19]
Roh

[11] Patent Number: 5,776,663
[45] Date of Patent: Jul. 7, 1998

[54] METHOD FOR ELECTROPLATING A CONDUCTIVE LAYER ON A SUBSTRATE

[75] Inventor: Jae-Woo Roh, Seoul, Rep. of Korea

[73] Assignee: Daewoo Electronics Co., Ltd., Seoul, Rep. of Korea

[21] Appl. No.: 596,026

[22] Filed: Feb. 6, 1996

[30] Foreign Application Priority Data

Jun. 30, 1995 [KR] Rep. of Korea ............... 95-18639

[51] Int. Cl.$^6$ ............................................. G03F 7/00
[52] U.S. Cl. ........................ 430/315; 430/330; 427/58; 427/256
[58] Field of Search ........................ 430/311, 315, 430/324, 330; 427/58, 96, 123, 126.1, 256, 259, 272, 282

[56] References Cited

U.S. PATENT DOCUMENTS 5,209,817  5/1993  Ahmad ............................ 156/643
5,529,863  6/1996  Swirbel ........................... 430/20

*Primary Examiner*—Kathleen Duda
*Attorney, Agent, or Firm*—Anderson, Kill & Olick, P.C.

[57] ABSTRACT

A method for forming a conductive layer on a substrate having a patterned seed layer thereon includes the steps of: (a) depositing a polyimide layer on the patterned seed layer and a part of the substrate which is not covered with the patterned seed layer; (b) directing a light beam onto a portion of the polyimide layer formed on top of the patterned seed layer; (c) developing the portion of the polyimide layer, thereby exposing the patterned seed layer; (d) curing the remaining portion of the polyimide layer at an appropriate condition, thereby turning it into an insulator; and (e) electroplating the conductive layer on the exposed patterned seed layer.

7 Claims, 4 Drawing Sheets

METHOD FOR ELECTROPLATING A CONDUCTIVE LAYER ON A SUBSTRATE

FIELD OF THE INVENTION

The present invention relates to a method for forming a conductive layer on a substrate; and, more particularly, to an improved method for forming a conductive layer on a substrate by employing a polyimide layer.

BACKGROUND OF THE INVENTION

In FIGS. 1A to 1F, there are provided schematic cross sectional views illustrating a prior art method for forming or electroplating a conductive layer on a substrate. As is well known, a process for forming the conductive layer 16 begins with the preparation of a substrate 10 having a top surface, as shown in FIG. 1A, whereon a seed layer 12, made of metal, is formed by using a technique such as sputtering. A photoresist layer 14 is deposited on top of the seed layer 12 by using a spin coating method, and then a portion thereof is patterned after a predetermined configuration. The patterned portion is then removed by a developer, thereby exposing a top surface of the seed layer 12 under the patterned portion.

In a subsequent step, the conductive layer 16 is formed on the exposed top surface of the seed layer 12, as illustrated in FIG. 1B, and the remaining portion of the photoresist layer 14 is removed by applying an appropriate solution, as shown in FIG. 1C. The seed layer 12 which is not covered with the conductive layer 16 is then removed by using an appropriate etchant, as depicted in FIG. 1D.

In order to insulate the conductive layer 16, a dielectric layer 18, made of an insulating material, e.g., silicon dioxide ($SiO_2$) or aluminum oxide($Al_2O_3$), is deposited on top of the conductive layer 16 and a part of the substrate 10 which is not covered with the patterned seed layer by employing, e.g., a sputtering method or an evaporation method, as illustrated in FIG. 1E.

However, the wedge-shaped topography formed by a lateral surface of the conductive layer 16 and the top surface of the substrate 10, as is shown in FIG. 1D, makes it difficult to deposit the dielectric layer 18 uniformly and may result in forming a sparsely filled dielectric layer region at the wedged portion. Furthermore, owing to a relatively large size and height of the conductive layer 16 rising above the top surface of the substrate 10 as shown in FIG. 1D, a bump of the dielectric layer 18 having a significant size is formed around the top of the conductive layer 16 as shown in FIG. 1E, which must be planarized in order to improve the optical resolution in a subsequent photolithographic process, as shown in FIG. 1F.

The above-described electroplating method, as illustrated in FIGS. 1A to 1F, involves the steps for forming and stripping off the photoresist layer 14, depositing the dielectric layer 18, patterning the dielectric layer 18 into a predetermined configuration and planarizing the top surface thereof. These complicated processes, therefore, tend to make it difficult to obtain the desired reliability and yield.

SUMMARY OF THE INVENTION

It is, therefore, an object of the present invention to provide a novel method for forming a conductive layer on a substrate by employing a polyimide layer.

In accordance with the present invention, there is provided a method for forming a conductive layer on a substrate having a top surface, said method comprising the steps of:

(a) forming a seed layer on the top surface of the substrate; (b) patterning the seed layer after a predetermined configuration; (c) depositing a polyimide layer on the patterned seed layer and a part of the substrate which is not covered with the patterned seed layer; (d) directing a light beam onto a portion of the polyimide layer formed on top of the patterned seed layer; (e) developing the portion of the polyimide layer, thereby exposing the patterned seed layer; (f) curing the remaining portion of the polyimide layer at an appropriate condition, thereby turning it into an insulator; and (g) electroplating the conductive layer on the exposed patterned seed layer.

BRIEF DESCRIPTION OF THE DRAWINGS

The above and other objects and features of the present invention will become apparent from the following description of preferred embodiments given in conjunction with the accompanying drawings, wherein.

DETAILED DESCRIPTION OF THE PREFERRED EMBODIMENTS

Referring to FIGS. 2A to 2E, there are shown schematic cross sectional views setting forth the steps involved in forming a conductive layer on a substrate in accordance with the present invention.

Figure 1A:
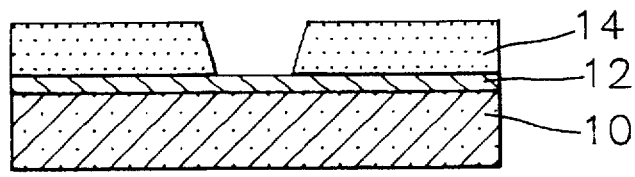
FIGS. 1A to 1F show schematic cross sectional views illustrating the manufacturing steps for forming a conductive layer on a seed layer previously disclosed.
Figure 1B:
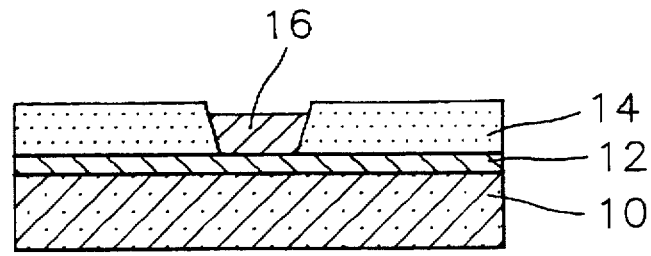
Figure 1C:
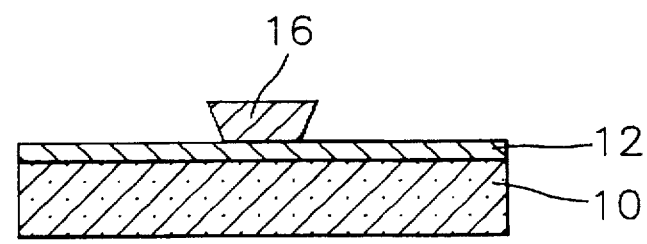
Figure 1D:
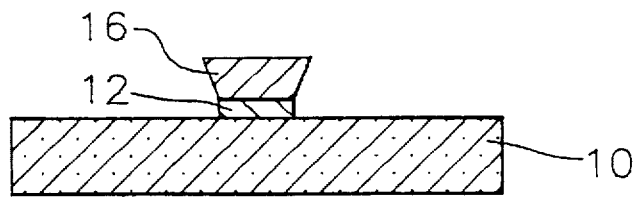
Figure 1E:
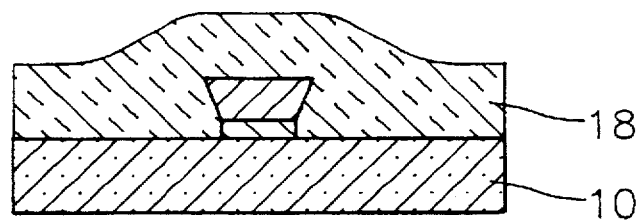
Figure 1F:
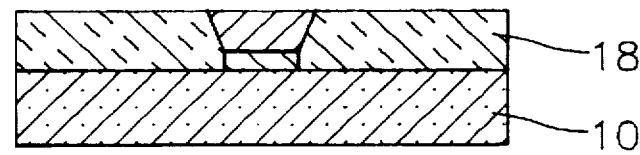
Figure 2A:
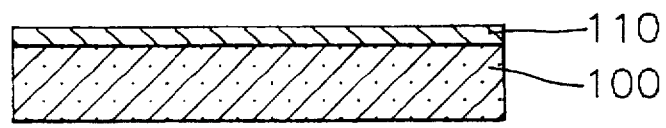
FIGS. 2A to 2E represent schematic cross sectional views setting forth the manufacturing steps for forming a conductive layer on a substrate in accordance with the present invention.

The forming of the conductive layer having a thickness of 3 to 5 μm begins with the preparation of the substrate 100 having the top surface, whereon a seed layer 110 having a thickness 100~200 Å is formed by using an evaporation method or a sputtering method, as shown in FIG. 2A. The seed layer 110 consists of a top and a bottom layers, each of the layers having a thickness of 50~100 Å, the top layer being made of a conductive material, e.g., gold(Au), and the bottom layer being usually made of titanium(Ti).

Figure 2B:
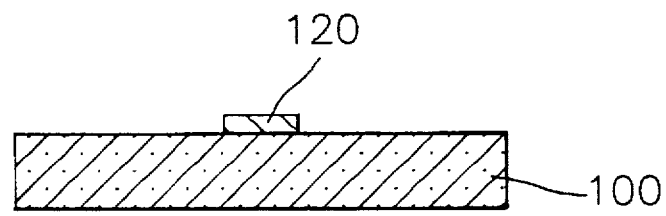

In a subsequent step, the seed layer 110 is patterned after a predetermined configuration using a photolithography method, thereby obtaining the patterned seed layer 120, as depicted in FIG. 2B.

Figure 2C:
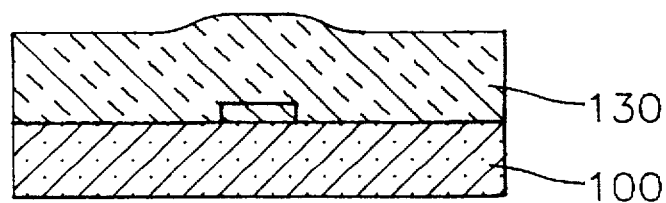

In a following step, a polyimide layer 130, which is photosensitive, is spin coated on top of the patterned seed layer 120 and a part of the substrate 100 which is not covered with the patterned seed layer 120, as illustrated in FIG. 2C. The thickness of the polyimide layer 130 is determined by that of the conductive layer to be formed.

Figure 2D:
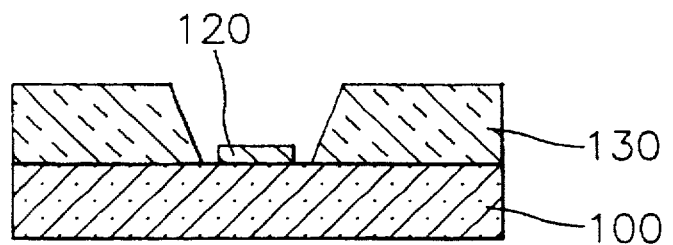

Thereafter, a portion of the polyimide layer 130 formed on top of the patterned seed layer 120 is exposed to a light beam, the exposed portion being developed by an appropriate developer, e.g., KOH or NaOH, thereby exposing the patterned seed layer 120, as depicted in FIG. 2D. Subsequently, the remaining portion of the polyimide layer 130 is cured at an appropriate condition, e.g., at 400 degrees for approximately 60 minutes, to solidify the remaining portion thereof, the remaining portion to serve as a dielectric layer for insulating the conductive layer to be formed.

Figure 2E:
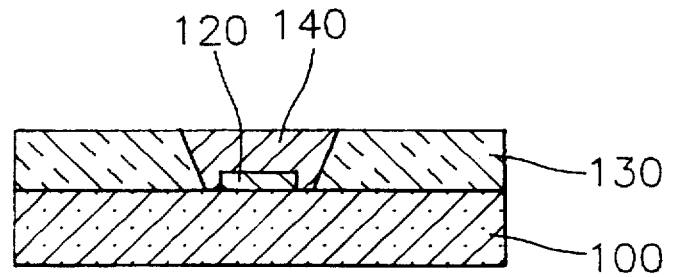

Thereafter, the conductive layer 140 is formed on top of the patterned seed layer 120 by using an electroplating method until a top surface of the conductive layer 140 is at a same level with that of the remaining portion of the polyimide layer 130, as represented in FIG. 2E.

In accordance with the present invention, the conductive layer 140 is made of a same or compatible material with that of the top layer of the patterned seed layer 120 to enhance an adhesion therebetween. For example, if the top layer of the patterned seed layer 120 is made of a magnetic material, e.g., Ni-Fe alloy or Ni-Fe-Co alloy, the conductive layer 140 should also preferably be made of the same material.

In comparison with the prior art method for forming a conductive layer on a seed layer, the inventive method dispenses with a number of difficult manufacturing steps, e.g., forming a photoresist layer, stripping off the photoresist and planarizing dielectric layer, thereby simplifying the overall manufacturing procedure and improving the reliability and yield. This is achieved by utilizing the polyimide layer which is photosensitive before the curing and becomes insulating after the curing.

While the present invention has been described with respect to certain preferred embodiments only, other modifications and variations may be made without departing from the scope of the present invention as set forth in the following claims.

What is claimed is:

1. A method for forming a conductive layer on a substrate having a top surface, said method comprising the steps of:
   (a) forming a seed layer on the top surface of the substrate;
   (b) patterning the seed layer in a predetermined configuration;
   (c) depositing a polyimide layer on the patterned seed layer and a part of the substrate which is not covered with the patterned seed layer;
   (d) directing a light beam onto a portion of the polyimide layer formed on top of the patterned seed layer;
   (e) developing the portion of the polyimide layer to expose the patterned seed layer;
   (f) curing the remaining portion of the polyimide layer under appropriate conditions to form an insulator; and
   (g) electroplating the conductive layer on the exposed patterned seed layer.

2. The method of claim 1, wherein the conductive layer has a thickness of 3 to 5 µm.

3. The method of claim 1, wherein a top surface of the conductive layer is at a same level with that of the polyimide layer.

4. The method of claim 1, wherein the seed layer includes a top and a bottom layers.

5. The method of claim 4, wherein the top layer is made of conductive material.

6. The method of claim 4, wherein each of the top and bottom layers of the seed layer has a thickness of 50 to 100 Å.

7. The method of claim 5, wherein the conductive layer is made of a same material as that of the top layer.

* * * * *